United States Patent
Rodriguez et al.

(10) Patent No.: US 6,535,389 B2
(45) Date of Patent: Mar. 18, 2003

(54) HEAT SINK MOUNTING ASSEMBLY

(75) Inventors: Veronica M Rodriguez, Frederick, CO (US); Guy R Wagner, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/877,824

(22) Filed: Jun. 7, 2001

(65) Prior Publication Data

US 2002/0186540 A1 Dec. 12, 2002

(51) Int. Cl.[7] ................................................. H05K 7/20
(52) U.S. Cl. ...................... 361/719; 165/80.2; 165/185; 257/718; 257/719
(58) Field of Search .............................. 165/80.2, 80.3, 165/185; 174/16.3; 257/706–707, 712–713, 718–719, 726–727; 361/697, 704, 707, 709–710, 715, 719–721

(56) References Cited

U.S. PATENT DOCUMENTS

| | | | | |
|---|---|---|---|---|
| 5,793,106 | A | * | 8/1998 | Yasukawa et al. ........... 257/717 |
| 6,014,315 | A | * | 1/2000 | McCullough et al. ........ 361/704 |
| 6,157,539 | A | * | 12/2000 | Wagner et al. ............... 361/704 |
| 6,252,774 | B1 | * | 6/2001 | Rife ........................... 361/704 |

* cited by examiner

Primary Examiner—Gregory Thompson

(57) ABSTRACT

A heat sink assembly mounting structure includes a base secured to a chassis wall by deformable retainer members. The retainer members are biased towards the chassis wall by screws, and the retainer members transmit the biasing force of the screws to the base. The base exerts a biasing force on a circuit board, and the screws extend through the circuit board and are screwed into nuts on the chassis wall.

20 Claims, 3 Drawing Sheets

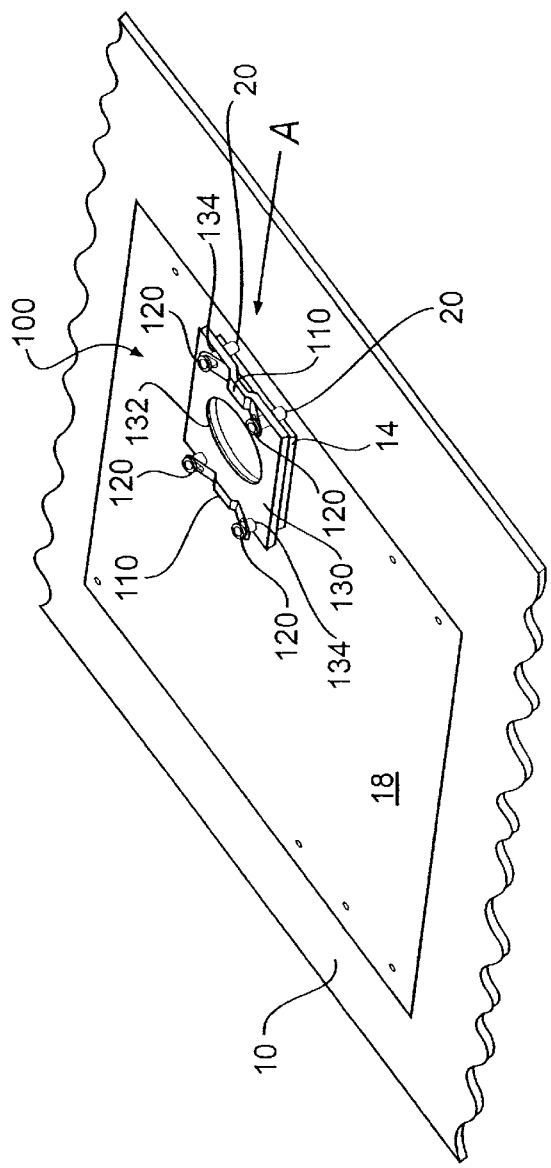
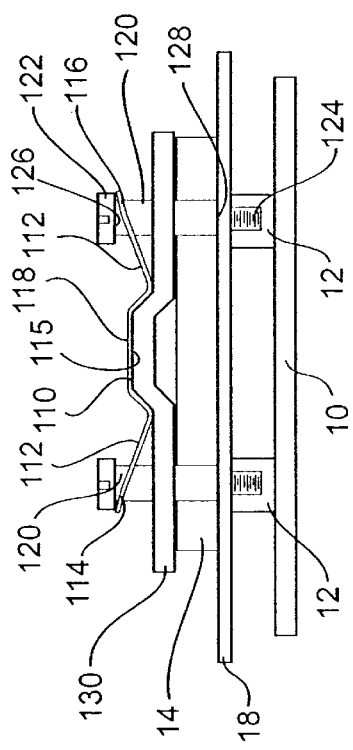

HEAT SINK MOUNTING ASSEMBLY

BACKGROUND OF THE INVENTION

1. Field of the Invention

The present invention relates to heat sink assemblies for cooling electronic components. Specifically, the present invention relates to a mounting structure for heat sink assemblies.

2. Background Art

Electronic components generate heat during operation, which may negatively affect their performance. In the case of consumer electronics, such as personal computers, televisions, and stereo equipment, electronic components are often mounted on circuit boards within an enclosed chassis. Chassis restrict air flow to electronic components, and cooling devices are often required to cool the electronic devices within a chassis. One such cooling device is a heat sink. Heat sinks are conductive heat radiating elements that draw heat from electronic components and dissipate the heat into cooler air. Fans are often incorporated into a chassis in order to circulate cooling air to render heat sinks more effective.

Heat sinks are often made from metallic components, and may be heavy and difficult to mount near electronic components. Because the heat sinks may be used in unison with fans, the mounting must also be resistant to vibration.

Conventional devices use complex mounting structures that are difficult to install on circuit boards, that utilize a combination of plastic and metal parts, and that fail to supply sufficient rigidity to the heat sink mounting.

Therefore, there is a need for a secure mounting structure for a heat sink assembly that is easy to install and that does not require a large number of components.

SUMMARY OF THE INVENTION

The present invention satisfies the above needs and may achieve other advantages not present in conventional devices.

According to a first aspect of the present invention, a heat sink mounting assembly includes a base having an opening for supporting the heat sink assembly, deformable retainer members that are engageable with the base to bias the base toward a chassis wall, and screws that exert a bias on the deformable retainer members. The screws may be screwed into nuts secured to the chassis. When the screws are tightened into the nuts, the deformable retainable members are deformed and biased against the base.

According to the first aspect of the invention, the base for supporting the heat sink assembly can be easily installed on a circuit board by screwing the screws into the nuts secured to the chassis. The deformable retainer members absorb shocks, and lessen the effects of vibration of the heat sink assembly. This feature allows for the use of larger and heavier heat sink assemblies, which more effectively convey heat away from components on the circuit board. In addition, because the screws are directly attached to the chassis through the nuts, the heat sink mounting assembly provides a secure attachment for the heat sink assembly.

According to a second aspect of the invention, the circuit board can include apertures for receiving the screws. The heat sink mounting assembly can therefore be easily mounted by simply placing the heat sink base over a socket of the circuit board, and inserting the screws into the apertures in the circuit board.

According to a third aspect of the invention, shoulders can be provided on the screws. The shoulders stop the advancement of the screws and alert the installer that the screws have been sufficiently screwed into the nuts. This feature further increases the ease of assembly of the mounting assembly.

Other aspects and advantages of aspects of the invention will be discussed with reference to the drawings figures and to the detailed description of the preferred embodiments.

BRIEF DESCRIPTION OF THE DRAWING FIGURES

FIG. 1 is a perspective view of a heat sink mounting assembly according to an embodiment of the present invention.

FIG. 2 is a side elevational view of the heat sink mounting assembly of FIG. 1 as seen from the direction of arrow A.

DETAILED DESCRIPTION OF THE PREFERRED EMBODIMENTS

Figures 3, 4:
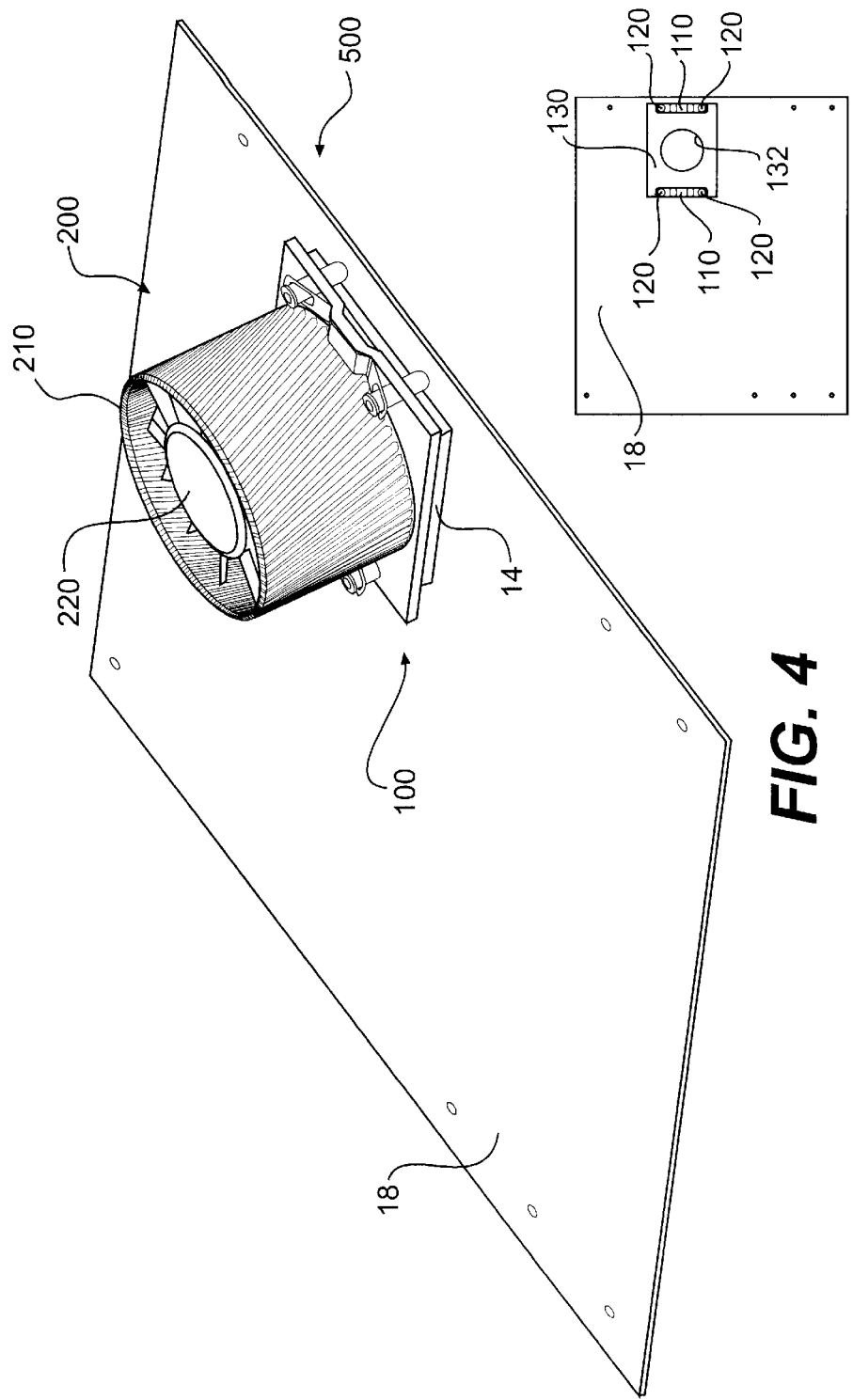
FIG. 3 is a plan view of the heat sink mounting assembly of FIG. 1.
FIG. 4 is a perspective view of a circuit board assembly according to an embodiment of the present invention.

A heat sink mounting assembly and circuit board assembly according to the present invention will be described below by way of preferred embodiments and with reference to the accompanying drawings.

FIG. 1 is a perspective view of a heat sink mounting assembly 100 according to an embodiment of the present invention. The heat sink mounting assembly 100 is secured to a circuit board 18 and mounted on a chassis wall 10. FIG. 2 is a side elevational view of the heat sink mounting assembly 100 of FIG. 1 as seen from the direction of arrow A.

Referring to FIG. 1, the heat sink mounting assembly 100 includes a base 130 having an opening 132 for supporting a heat sink assembly, two deformable retainer members 110, and four screws 120 for biasing the retainer members 110 against the base 130. The base 130 includes four apertures 134, and the circuit board 18 includes four apertures 20 (only two shown in FIG. 1). The screws 120 extend through the apertures 134 and through the apertures 20 and are engaged with the chassis wall 10 by threaded attachment (not shown).

FIG. 2 illustrates the base 130 installed on the circuit board 18. The circuit board 18 may include a socket 14, which may house components such as a central processing unit, and other components of the circuit board 18.

As illustrated by FIG. 2, when the heat sink mounting assembly 100 is installed, the retainer member 110 is deflected at each end by a screw 120. The screws extend through an aperture 114 at either end of the retainer member 110, and a head 122 of the screws engages an engagement surface 116 of the retainer member 110 at an engagement surface 126. The retainer members 110 are elongated, with deformable portions 112 created by the four bends in the retainer member 110. A lower engagement surface 115 of the retainer member 110 may engage a raised portion 118 of the base 130. Alternatively, the base 130 can be substantially flat, and the retainer members 110 can be bent in any manner appropriate to allow for deflection of the retainer members by the screws 120.

The base 130 is biased towards the chassis wall 10 under the action of the retainer members 110. The base 130 transmits the bias force to the circuit board 18 through the socket 14. Threaded ends 124 of the screws 120 are secured to the chassis wall 10 by female threaded nuts 12. The nuts 12 can be secured to the chassis wall 10 by, for example, welding, soldering, adhesives, and other joining operations.

The retainer members 110, which are deformable, provide a shock absorbing and vibration attenuating function for the heat sink mounting assembly 100. For example, when the base 130 is vibrated by, for example, a fan of a heat sink assembly, the vibrations will be attenuated by the retainer members 110. Vibrations also occur due to the operation of other components in a chassis, and during transport of the chassis. The retainer members 110 are illustrated as flat, elongated metallic elements, however, they may have other shapes and configurations. For example, a wound wire element could be formed into a retainer member. Also, instead of a single retainer member 110 being biased by two screws 120, a coiled spring (not shown) could be placed between the head 122 each screw 120 and the base 130. In this configuration, the heads 122 of the screws 120 could be flared to provide a sufficiently large engagement surface 126 for the coiled springs to abut. Alternatively, a washer could be provided between a spring and the head of a screw 120.

In addition to the shock absorbing and vibration attenuating capabilities conferred by the retainer members 110, the screws 120 are exceptionally securely attached to the chassis via the nuts 12. Direct attachment of the screws 120 to the chassis wall 10 also transfers most of the load from a heat sink to the chassis wall 10, rather than to the more fragile circuit board 18.

The screws 120 each include a shoulder 128. Each screw 120 has an unthreaded length chosen so that its shoulder 128 abuts the circuit board 18 when the threaded end 124 is fully threaded into the nut 12. The inclusion of the shoulders 128 ensures that the retainer members 110 are deformed by a uniform amount with each installation of the heat sink mounting assembly 100. The shoulders 128 also provide for quick installation of the heat sink mounting assembly 100.

In order to install the heat sink mounting assembly 100, an installer places the socket 14 on the circuit board 18, if the socket 14 is not already attached to the circuit board 18, and then places the base 130 on the socket 14. The screws 120 are inserted through the apertures 114 in the retainer members 110, through the apertures 134 in the base 130, through the apertures 20 in the circuit board 18, and into the nuts 12. The screws 120 are then tightened until the shoulders 128 engage the circuit board 18. The retainer members 110 deform as the screws 120 are tightened, and bias the heat sink mounting assembly 100 toward the chassis wall 10.

The illustrated embodiments disclose screws 120 for securing the heat sink mounting assembly 100 to the chassis wall 10, however, other types of attachment members, such as bolts and other threaded members, could be used.

FIG. 3 is a plan view of the heat sink mounting assembly 100 of FIG. 1. As illustrated by FIG. 3, a deformable retainer member 110 can be included on either side of the base 130, with the opening 132 located between the retainer members 110. This configuration ensures that vibrations caused by a heat sink assembly installed in the opening 132 are evenly distributed among the two retainer members 110. Although two retainer members 110 are illustrated in FIG. 3, additional retainer members could be included to more securely mount the base 130 on the circuit board 18.

FIG. 4 is a perspective view of a circuit board assembly 500 according to an embodiment of the present invention. In FIG. 4, the circuit board assembly 500 includes the circuit board 18, the heat sink mounting assembly 100, and a heat sink assembly 200 mounted on the heat sink mounting assembly 100. The heat sink assembly 200 includes a heat sink 210, and a fan 220 for circulating air for cooling the heat sink 210. The heat sink assembly 200 serves to draw heat from components within the socket 14. The fan 210 serves to circulate air through slots in the heat sink 210, and to increase the heat dissipation from the heat sink 210.

The base 130 can be made from, for example, aluminum, steel, aluminum alloys, or other heat conductive materials. The heat sink 210 may also be made from aluminum, steel, aluminum alloys, or other heat conductive materials.

Figure 5:
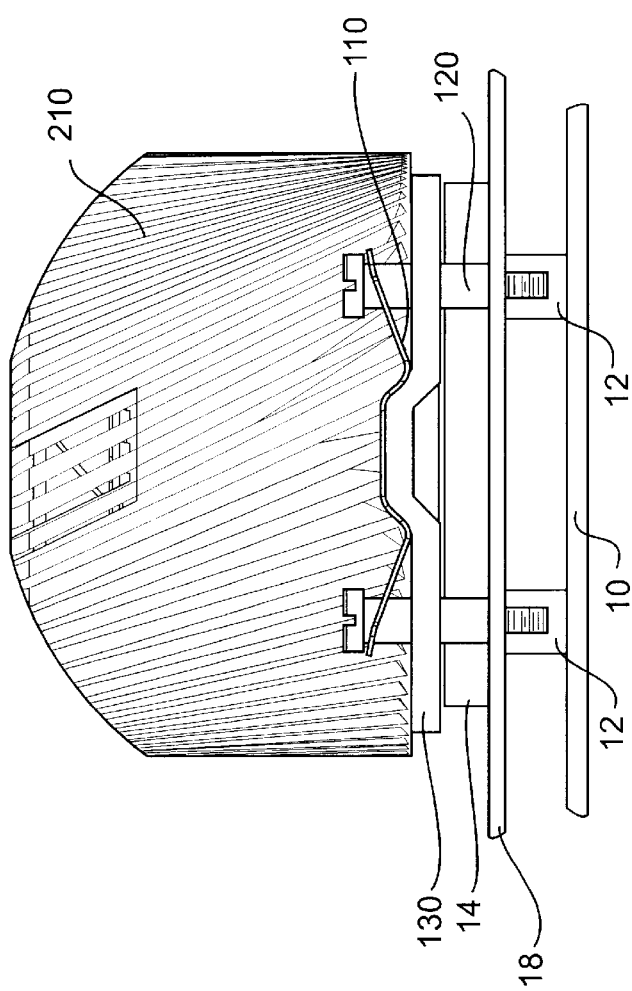
FIG. 5 is a side elevational view of the circuit board assembly illustrated in FIG. 4.

FIG. 5 is a side elevational view of the circuit board assembly 500 illustrated in FIG. 4. The heat sink assembly 200 rests on the base 130, and includes an annular ring (not shown) that is engageable with the opening 132 (not shown in FIG. 5) in the base 130. The ring can be press-fitted into the opening 132 to secure the heat sink assembly 200 to the base 130. The ring can also be secured in the opening by staking.

Figure 6:
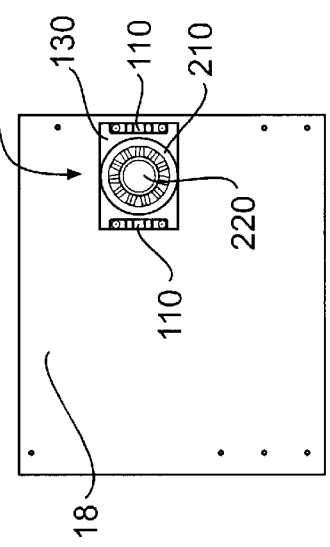
FIG. 6 is a plan view of the circuit board assembly illustrated in FIG. 4.

FIG. 6 is a plan view of the circuit board assembly 500 illustrated in FIG. 4. As illustrated by FIG. 6, the retainer members 110 are positioned on either side of the heat sink mounting assembly 100 so as to securely mount the heat sink assembly 200 to the circuit board 18.

While the present invention is described with reference to exemplary embodiments, it will be understood that many modifications will be readily apparent to those skilled in the art, and the present disclosure is intended to cover variations thereof.

What is claimed is:

1. A heat sink mounting assembly, comprising:
   a base having an opening for supporting a heat sink assembly;
   one or more deformable retainer members, each retainer member having:
   a lower engagement surface engageable with the base to bias the base toward a support;
   two apertures; and
   one or more attachment element engagement surfaces; and
   one or more attachment elements, each attachment element having an engagement surface engageable with the one or more attachment element engagement surfaces to bias the one or more retainer members toward the base, wherein the apertures in the one or more retainer members are sized to accommodate the one or more attachment elements.

2. The heat sink mounting assembly of claim 1 comprising a first retainer member and a second retainer member.

3. The heat sink mounting assembly of claim 2 comprising four attachment elements.

4. The heat sink mounting assembly of claim 3, wherein the base includes four apertures, each aperture being arranged in the base to accommodate one of the attachment elements.

5. The heat sink mounting assembly of claim 4, wherein two of the four apertures in the base are arranged on a first side of the base, and two of the apertures are arranged on a second side of the base, and wherein the opening in the base is located between the first and second sides of the base.

6. The heat sink mounting assembly of claim 5, wherein the attachment elements are screws, each screw including a threaded portion and a head, the screws having a length sufficient to extend through the base, a socket, and a circuit board to engage threaded portions of the support.

7. The heat sink mounting assembly of claim 5, wherein the retainer members are elongated deformable members, the apertures in each retainer member being located at each end of the retainer member, and wherein a spacing between the apertures of the first retainer member is the same as a spacing between the apertures on the first side of the base, and the spacing between the apertures of the second retainer member is the same as a spacing between the apertures on the second side of the base.

8. The heat sink mounting assembly of claim 2, wherein the retainer members are elongated deformable members, and wherein each retainer member is deformed when an attachment element engaged with the retainer member is advanced toward the support.

9. The heat sink mounting assembly of claim 8, wherein the retainer members each include four bends and a raised portion at a center portion of each retainer member.

10. The heat sink mounting assembly of claim 3, wherein each attachment element includes a threaded portion and shoulder.

11. A circuit board assembly, comprising:
a support;
a circuit board;
a base located on a surface of the circuit board, wherein the base comprises an opening;
a heat sink assembly mounted in the opening of the base;
one or more deformable retainer members engaged with the base; and
one or more attachment elements extending through the one or more retainer members and the base and operably connected to the support, the one or more attachment elements biasing the one or more retainer members toward the base, wherein the base and the circuit board are biased toward the support.

12. The circuit board assembly of claim 11 comprising two retainer members and four attachment elements.

13. The circuit board assembly of claim 12, wherein the base includes four apertures, and the retainer members each include two apertures, each of the attachment elements extending through one of the four apertures in the base and through an aperture in one of the retainer members.

14. The circuit board assembly of claim 13, wherein the attachment elements each include a threaded portion and a head, the threaded portion of each attachment element being threaded into a corresponding threaded nut secured to the support.

15. The circuit board assembly of claim 13, wherein two of the four apertures in the base are arranged on a first side of the base, two of the apertures are arranged on a second side of the base, and the opening in the base is located between the first and second sides of the base.

16. The circuit board assembly of claim 13, wherein the retainer members each include four bends and a raised portion at a center portion of each retainer member.

17. The circuit board assembly of claim 12, wherein the retainer members are elongated deformable members, and wherein ends of the retainer members are deformed by the bias of the attachment elements.

18. The circuit board assembly of claim 12, wherein the attachment elements each include a threaded portion and a shoulder.

19. The circuit board assembly of claim 12, wherein the circuit board includes a socket.

20. The circuit board assembly of claim 11, wherein the circuit board is located between the base and the support.

* * * * *